United States Patent
Hirth

(10) Patent No.: US 9,450,705 B2
(45) Date of Patent: Sep. 20, 2016

(54) METHOD AND APPARATUS FOR DETECTING FRAME DELIMITERS IN ETHERNET PASSIVE OPTICAL NETWORKS WITH FORWARD ERROR CORRECTION

(75) Inventor: Ryan E. Hirth, Windsor, CA (US)

(73) Assignee: Broadcom Corporation, Irvine, CA (US)

( * ) Notice: Subject to any disclaimer, the term of this patent is extended or adjusted under 35 U.S.C. 154(b) by 1437 days.

(21) Appl. No.: 12/828,568

(22) Filed: Jul. 1, 2010

(65) Prior Publication Data

US 2011/0004809 A1   Jan. 6, 2011

Related U.S. Application Data

(60) Provisional application No. 61/223,359, filed on Jul. 6, 2009.

(51) Int. Cl.
*H04L 1/00* (2006.01)
*H03M 13/33* (2006.01)

(52) U.S. Cl.
CPC .......... *H04L 1/0083* (2013.01); *H03M 13/333* (2013.01); *H04L 1/0045* (2013.01)

(58) Field of Classification Search
CPC ........................... H04L 1/0045; H04L 1/0083
USPC ......................................................... 714/798
See application file for complete search history.

(56) References Cited

U.S. PATENT DOCUMENTS

| | | | | |
|---|---|---|---|---|
| 5,598,419 | A * | 1/1997 | Weigand et al. | 370/514 |
| 7,152,199 | B2 * | 12/2006 | Nuyen et al. | 714/776 |
| 7,489,869 | B2 * | 2/2009 | Kazawa et al. | 398/71 |
| 7,876,244 | B2 * | 1/2011 | Brunner et al. | 341/100 |
| 7,953,324 | B2 * | 5/2011 | Leung et al. | 398/58 |
| 2010/0316379 | A1 * | 12/2010 | Suvakovic | 398/58 |

* cited by examiner

*Primary Examiner* — Steve Nguyen
(74) *Attorney, Agent, or Firm* — Sterne, Kessler, Goldstein & Fox, P.L.L.C.

(57) ABSTRACT

Embodiments of the present invention provide a system that identifies an even delimiter in a forward error correction (FEC)-coded Ethernet frame. The system receives an FEC-coded Ethernet frame that includes the even delimiter, which is a predetermined sequence that separates a conventional Ethernet frame and FEC parity bits in the FEC-coded Ethernet frame. Next, the system scans a bit stream of the FEC-coded Ethernet frame. Then, the system determines a first Hamming distance between a first consecutive set of frame bits in the bit stream and the even delimiter. The system also determines a second Hamming distance between a second consecutive set of frame bits in the bit stream and the even delimiter. Both the first and second Hamming distances are shorter than a predefined value. The system subsequently selects one of the first and second sets of frame bits having the shorter Hamming distance as the even delimiter.

17 Claims, 6 Drawing Sheets

FEC-ENCODED ETHERNET FRAME FORMAT

| SFEC 110 | PREAMBLE/ SFD 120 | DATA FRAME 130 | FCS 140 | TFEC 150 | PARITY 160 | TFEC 170 |

FIG. 1 (PRIOR ART)

FRAME CONTAINING TFEC_E 210

| 0 | 1 | 2 | 3 | 4 | 5 | 6 | 7 | 8 | 9 |
|---|---|---|---|---|---|---|---|---|---|
| DATA | DATA | 2E8 /T/ | 3A8 /R/ | 0FA /K28.5/ | 11A /D29.5/ | 2E8 /T/ | 3A8 /R/ | PRTY | PRTY |

FRAME CONTAINING TFEC_O 220

| 0 | 1 | 2 | 3 | 4 | 5 | 6 | 7 | 8 | 9 |
|---|---|---|---|---|---|---|---|---|---|
| DATA | 2E8 /T/ | 3A8 /R/ | 3A8 /R/ | 0FA /K28.5/ | 11A /D29.5/ | 2E8 /T/ | 3A8 /R/ | PRTY | PRTY |

FIG. 2 (PRIOR ART)

METHOD AND APPARATUS FOR DETECTING FRAME DELIMITERS IN ETHERNET PASSIVE OPTICAL NETWORKS WITH FORWARD ERROR CORRECTION

CROSS-REFERENCE TO RELATED APPLICATIONS

This application claims the benefit of U.S. Provisional Application No. 61/223,359, filed Jul. 6, 2009, entitled "Method and Apparatus for Detecting Frame Delimiters in Ethernet Passive Optical Networks with Forward Error Correction," which is incorporated herein by reference in its entirety.

BACKGROUND OF THE INVENTION

1. Field of the Invention

This disclosure is generally related to the network design. More specifically, this disclosure is related to a method and apparatus for detecting frame delimiters in Ethernet Passive Optical Network (EPON) frames with Forward Error Correction (FEC) code.

2. Background Art

EPONs have become a popular candidate for next-generation access networks, because they offer the simplicity and scalability of Ethernet with the cost-efficiency and high capacity of passive optics. Typically, EPONs are used in the first mile of the network that connects service subscribers to a central office of a service provider. However, since EPONs adopt passive optical transmission technology, which does not involve amplification or regeneration, the size of a network is subject to power budget and various transmission impairments. As a result, the signal-to-noise ratio of an EPON suffers as the network increases its size, resulting in more frequent bit errors.

Forward error correction (FEC) techniques are often used to provide robustness against bit errors. With the FEC technique, a receiving device has the capability to detect and correct any block of symbols that contains fewer than a predetermined number of error symbols. A transmitting device accomplishes FEC by adding bits to each transmitted symbol block, using a predetermined error correction technique. One exemplary technique is the use of Reed-Solomon code. A Reed-Solomon code is specified as RS(l, k) with s-bit symbols, which means that the encoder takes k data symbols of s bits each, and adds (l-k) parity symbols to make an l-symbol codeword. A Reed-Solomon decoder can correct up to t symbols that contain errors in a codeword, where
2t=l-k. For example, RS(255, 239) with 8-bit symbols means that each codeword contains 255 bytes, of which 239 bytes are data and 16 bytes are parity. The decoder can automatically correct errors contained in up to 8 bytes anywhere in the codeword.

In order to ensure that FEC-coded Ethernet frames are backward-compatible (i.e. recognizable by non-FEC-capable equipments), IEEE 802.3ah Ethernet in the First Mile standard proposes that the FEC parity bits for all blocks of data symbols are aggregated and appended to a conventional Ethernet frame. A delimiter that can be recognized by a non-FEC-capable equipment delineates the conventional Ethernet frame from the parity bits. FIG. 1 illustrates an exemplary FEC-encoded Ethernet frame format. In this example, an FEC-coded Ethernet frame starts with a start code sequence 210 (called "SFEC"). Following SFEC is an Ethernet frame, which includes a preamble/start-of-frame delimiter (SFD) field 120, a data frame 130, and a frame-check-sequence (FCS) field 140. FCS field 140 typically contains a cyclic redundancy check (CRC) sequence. Following FCS field 140 is a first delimiter TFEC 150 indicating the end of the Ethernet frame. Another purpose of TFEC 150 is to delineate the Ethernet frame from the following FEC parity bits.

A byte of data is mapped to two 10-bit sequences (called "code groups") in an EPON in order to maintain a balanced running disparity. For example, an octet of hexadecimal value 50 (01010000 in binary format) is mapped to code group 0110110101 and code group 1001000101. This pair of code groups is identified as "D16.2". "D" indicates that this pair of code groups is used for data. "16" is the decimal value of the lower five bits of the octet ("10000"), and "2" is the decimal value of the higher three bits of the octet ("010"). Besides data code groups, there are also special code groups used for control purposes. For example, "K28.5" corresponds to code groups 0011111010 and 1100000101. Here, "K" indicates that it is a special code group, and "28.5" indicates the corresponding octet value. In addition, the IEEE 802.3 standard also defines special control sequences (called "ordered sets"). For example, ordered set /I1/ (/K28.5/D5.6/) is the IDLE ordered set. It is defined such that the running disparity at the end of the transmitted /I1/ is opposite to that of the beginning running disparity. The IDLE ordered set /I2/ (/K28.5/D16.2) is defined such that the running disparity at the end of the transmitted /I2/ is the same as the beginning running disparity. The first IDLE ordered set following a packet or a control sequence restores the current positive or negative running disparity to a negative value. All subsequent IDLEs are /I2/ to ensure a negative running disparity. Other ordered sets include /R/ (Carrier Extend, /K23.7/), /S/ (Start of Packet, /K27.8/), and /T/ (End of Packet, /K29.7).

According to the IEEE 802.3 standard (for non-FEC-coded Ethernet), an end-of-packet delimiter should be either /T/R/ or /T/R/R/. The reason for having two delimiters is to ensure that the code group that follows the delimiter falls in an even-numbered position. Therefore, /T/R/ is used when /T/ is in an even-numbered position, and /T/R/R/ is used when /T/ is in an odd-numbered position. Accordingly, as proposed in the IEEE 802.3ah standard, TFEC 150 has two sequences: TFEC_E (/T/R/I/T/R) to be used when the first /T/ is in an odd-numbered position, and TFEC_O (/T/R/R/I/T/R) to be used when the first /T/ is in an even-numbered position. Note that TFEC_E and TFEC_O include the conventional end-of-packet delimiter (/T/R/ and /T/R/R/, respectively). Therefore, a non-FEC-capable receiving device can recognize the end of an Ethernet packet. Following TFEC field 150 are the FEC parity bits 160. According to the current 802.3ah standard, FEC parity bits 160 are based on RS(255, 239) codes derived from the Ethernet frame and do not protect TFEC field 150 against bit errors. After the FEC parity bits is another TFEC field 170 which terminates the entire FEC-coded frame. Because the beginning of the parity bits is always in an even-numbered position due to TFEC 150, and because the total number of parity bits is always even, TFEC 170 uses only the TFEC_E sequence.

FIG. 2 illustrates the code-group sequence of delimiters TFEC_E and TFEC_O according to the current IEEE 802.3ah standard. Frame 210 uses an even TFEC delimiter, TFEC_E, as its delimiter between the conventional Ethernet frame and the FEC parity bits, because the first code group of the delimiter is in an even-numbered position. Frame 220 uses an odd TFEC delimiter, TFEC_O, as its delimiter between the conventional Ethernet frame and the FEC parity bits, because the first code group of the delimiter is in an odd-numbered position. In order to detect the delimiter, a receiving device scans the input stream of symbols for a match with TFEC_E or TFEC_O. Because the delimiter is not protected by FEC, a number of bit errors may be tolerated. According to the current IEEE 802.3ah standard, up to five bit errors are tolerated in the process of matching TFEC delimiters. Furthermore, the current IEEE 802.3 standard identifies the first sequence that has a shorter than 5-bit Hamming distance to TFEC delimiters as the TFEC. Because the /T/R/ pattern is repeated twice in the TFEC_E sequence, the TFEC_E sequence has a high auto-correlation. As a result, it is prone to mismatch the /T/R/ pattern in the TFEC_E sequence under the current IEEE 802.3 standard. The misidentification of TFEC_E will cause the receiver to misrecognize the end of the frame.

BRIEF SUMMARY OF THE INVENTION

One embodiment provides a system that identifies an even delimiter in a forward error correction (FEC)-coded Ethernet frame. During operation, the system receives an FEC-coded Ethernet frame that includes an even delimiter used to separate a conventional Ethernet frame and FEC parity bits in the FEC-coded Ethernet frame. The even delimiter is a predetermined bit sequence. The system then scans a bit stream of the FEC-coded Ethernet frame. Next, the system determines a first Hamming distance between a first consecutive set of frame bits in the bit stream and the even delimiter. The system also determines a second Hamming distance between a subsequent second consecutive set of frame bits in the bit stream and the even delimiter. Both the first and second Hamming distances are shorter than a predefined value. The system subsequently selects one of the first and second sets of frame bits having the shorter Hamming distance as the even delimiter.

In some embodiments, the even delimiter starts with first code groups /T/R/ according to the IEEE 802.3 Ethernet standard, and includes a number of code groups after the first code groups /T/R/.

In some embodiments, the first and second consecutive sets of frame bits are located within an enhanced delineator window, which specifies a start position and an end position in the bit stream.

In some embodiments, the enhanced delineator window is longer than a delineator window defined in the IEEE 802.3 Ethernet standard.

In some embodiments, the even delimiter ends with second code groups /T/R/ according to the IEEE 802.3 Ethernet standard.

In some embodiments, selecting one of the first and second sets of frame bits having the shorter Hamming distance as the even delimiter reduces the probability of misidentifying a first /T/R/ sequence in the bit stream, which corresponds to the first code groups /T/R/ in the even delimiter, as a second /T/R/ sequence, which corresponds to the second code groups /T/R/ in the even delimiter.

In some embodiments, the even delimiter is used to separate the conventional Ethernet frame from the FEC parity bits when the last symbol of the conventional Ethernet frame is an odd-numbered position.

In some embodiments, determining the second Hamming distance between the subsequent consecutive set of frame bits in the bit stream is repeated until a best-matched set with the shortest Hamming distance to the even-delimiter is found or the end of an enhanced delineator window is reached.

BRIEF DESCRIPTION OF THE DRAWINGS/FIGURES

FIG. 1 illustrates an exemplary FEC-encoded Ethernet frame format (prior art).

FIG. 2 illustrates the code-group sequence of delimiters TFEC_E and TFEC_O according to the current IEEE 802.3ah standard (prior art).

Figure 6:
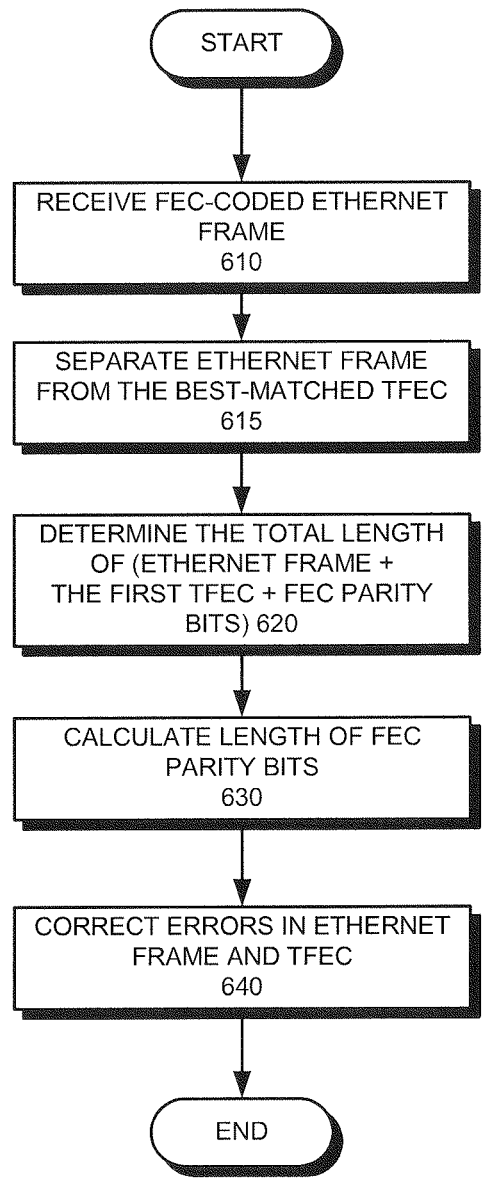

FIG. 6 presents a flow chart illustrating the process of calculating the length of FEC parity bits and subsequent data delineation in accordance with an embodiment.

Figure 7:
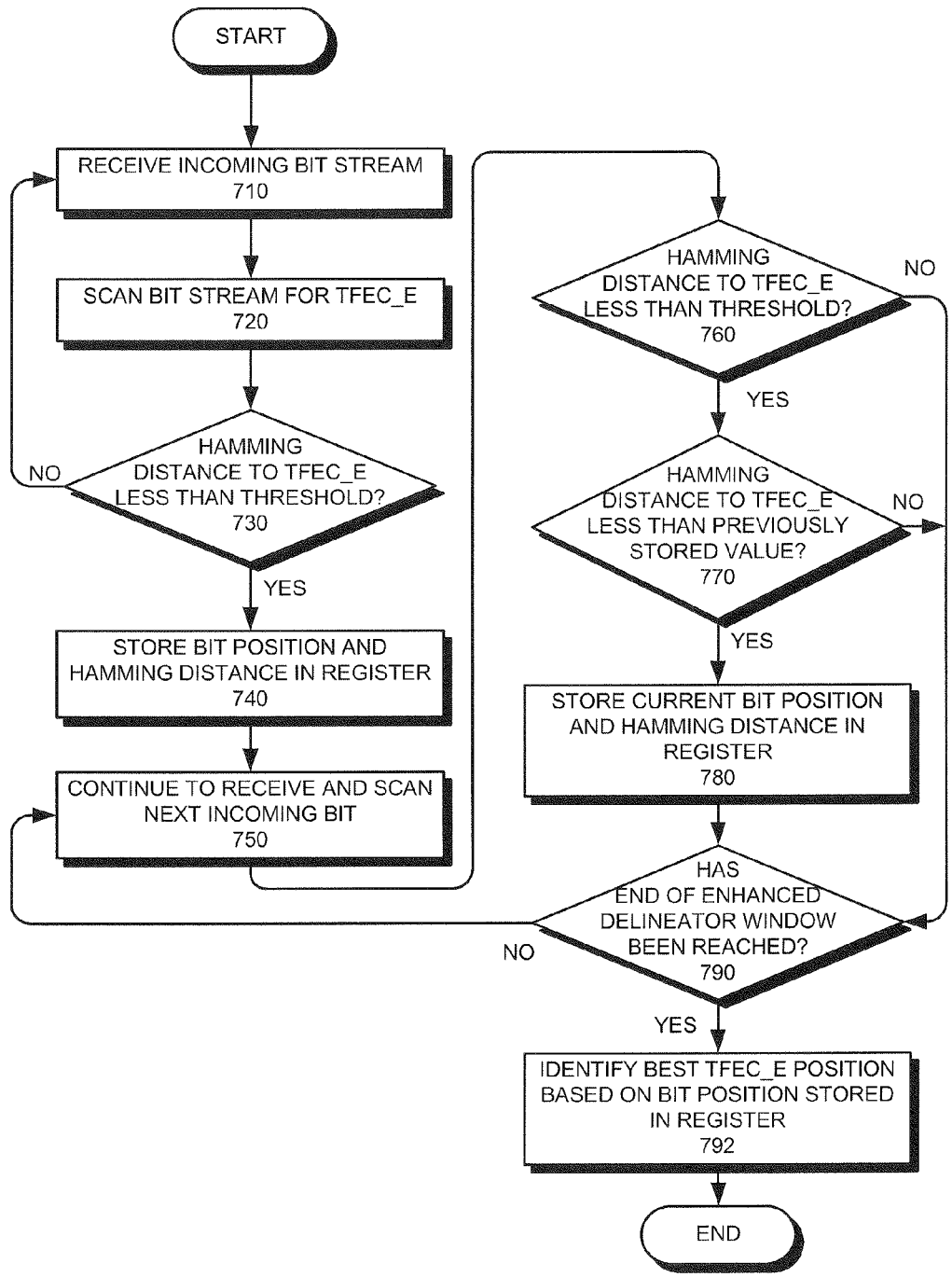

FIG. 7 presents a flow chart illustrating the process of identifying TFEC_E using the best-match logic in accordance with an embodiment.

In the figures, like reference numerals refer to the same figure elements.

DETAILED DESCRIPTION OF THE INVENTION

The following description is presented to enable any person skilled in the art to make and use the embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the present invention is not limited to the embodiments shown, but is to be accorded the widest scope consistent with the principles and features disclosed herein.

Overview

In embodiments of the present invention, the problem of potential TFEC_E misidentification is solved by implementing an improved matching logic that scans through an enhanced delineator window to identify the best match to the TFEC_E sequence with the shortest Hamming distance.

Figure 3:
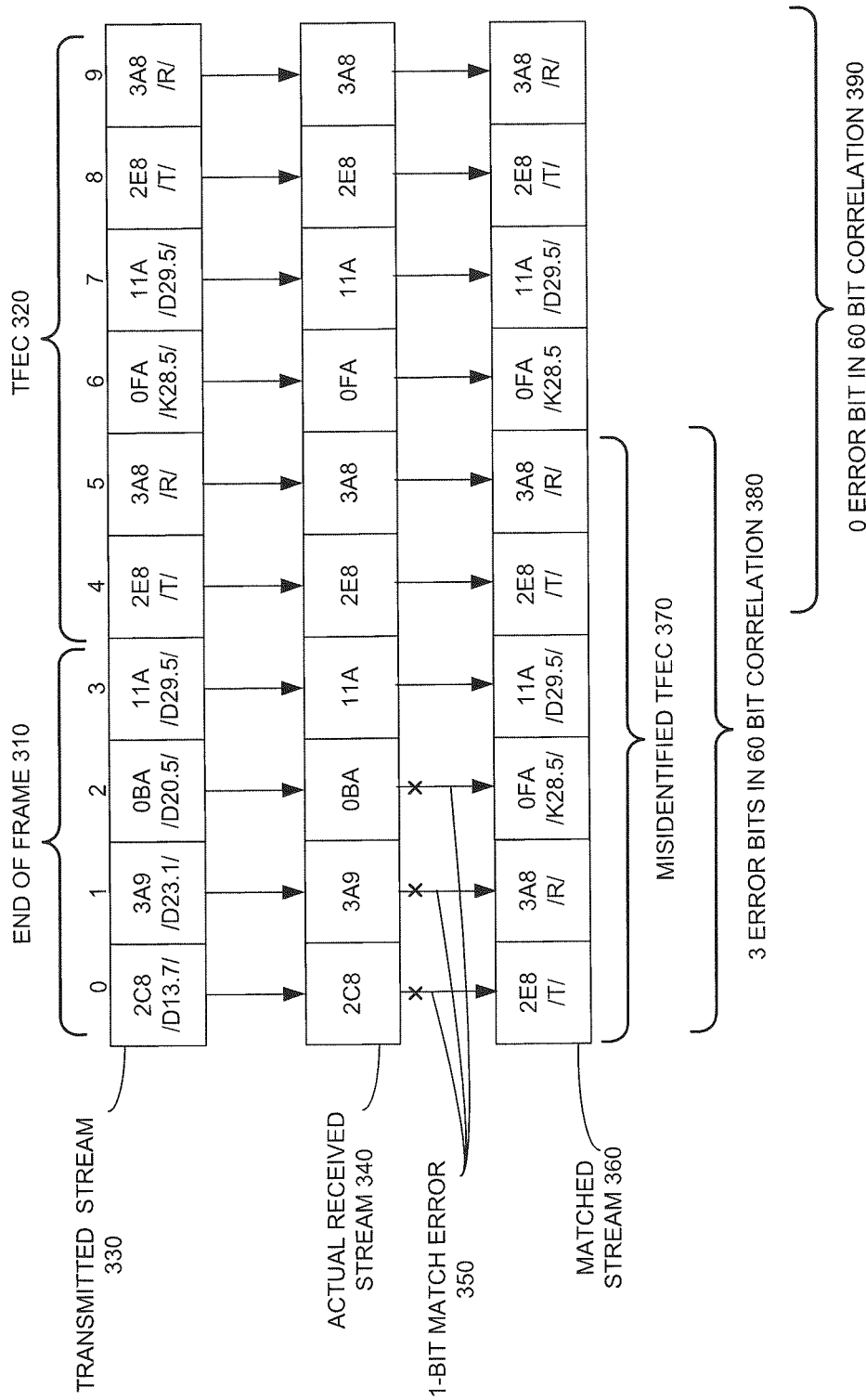
FIG. 3 illustrates an example of a potential misidentification of TFEC sequence in accordance with the current IEEE 802.3 standard.

As previously described, the current IEEE 802.3 standard identifies the first sequence in an incoming frame that has a shorter than 5-bit Hamming distance to TFEC_E delimiters as the TFEC_E. Moreover, the standard defines TFEC_E sequence as /T/R/I/T/R/. Because the /T/R/ pattern is repeated twice in the TFEC_E sequence, the TFEC_E sequence has a high auto-correlation. As a result, it is possible for the end of a packet to match such criteria, i.e. with a Hamming distance to TFEC_E less than a pre-defined value (e.g., 5 bits). FIG. 3 and the following section illustrate in details the problem with identifying TFEC under the current IEEE 802.3 standard. Since the TFEC_E delineating the frame and the parity bits indicates the end of data frame, the misidentification of the TFEC_E sequence will cause the receiver to misrecognize the end of the frame.

Embodiments of the present invention use an enhanced delineator window, which is longer than a conventional delineator window, to predetermine start and end positions in an incoming bit stream to scan for a matching TFEC_E sequence. The receiving device scans through all frame bits within the enhanced delineator window. While scanning the frame bits in the bit stream, the receiving device temporarily stores potential matches for the TFEC_E sequence when the frame bits have a shorter than 5-bit Hamming distance to TFEC_E. Then, the receiving device selects, among the potential matches, the frame bits within the enhanced delineator window having the shortest Hamming distance to TFEC_E as the matching TFEC_E.

Problem with Identifying TFEC Using First-Match

FIG. 3 illustrates an example of a potential misidentification of TFEC sequence using the match logic in accordance with the current IEEE 802.3 standard. In this example, a transmitted bit stream 330 has a portion indicating the end of a frame 310 and a TFEC 320 following the end of frame 310. In this particular embodiment, the bits in the end of frame 310 follow a data sequence of /D13.7/D23.1/D20.5/D29.5/. The TFEC 320 is an even TFEC, which has a special control sequence of /T/R/K28.5/D29.5/T/R/ under the IEEE 802.3 standard. Note that if a running parity at the end of the conventional Ethernet frame is negative, the number of code groups after the code groups /T/R/ includes sequence /K28.5/D29.5/ according to the IEEE 802.3 Ethernet standard. If the running parity at the end of the conventional Ethernet frame is positive, the number of code groups after the code groups /T/R/ includes sequence /K28.5/D10.1/ according to the IEEE 802.3 Ethernet standard. Although the data sequences at the end of the frame may vary from packet to packet, they would not significantly reduce the likelihood of misidentifying TFEC_E, because the problem is created by the intrinsic characteristic of high auto-correlation in the TFEC_E sequence.

Assuming that there was no transmission error in this example, the actual received stream 340 would be identical to the transmitted stream 330. Next, assuming that there is a 1-bit match error 350 occurring in each of the first three code groups respectively. That is, there exists a 1-bit match error between /D13.7/ (i.e., hex number 2C8) and /T/ (i.e., hex number 2E8); a 1-bit match error between /D23.1/ (i.e., hex number 3A9) and /R/ (i.e. hex number 3A8); and a 1-bit match error between /D20.5/ (i.e. hex number 0BA) and /K28.5/ (i.e. hex number 0FA). In other words, the Hamming distance between the bit sequence in the actual received stream 340, which starts from the end of frame 320, and TFEC_E would be less than 5 bits. Therefore, the match logic under the current IEEE 802.3 standard would match the actual received stream 340 to the matched stream 360 with 3 error bits in 60 bit correlation 380. As a result, the match logic under the current IEEE 802.3 standard would misidentify the first 60 bits in the illustration as misidentified TFEC 370 and cause a frame error.

Nevertheless, TFEC 320 in the transmitted stream 330 actually starts from the 5th code group. As shown in the illustration, there is no error bit between the transmitted stream 330 and the matched stream 360 over the 60-bit correlation 390 corresponding to the actual TFEC 320. The bits corresponding to the 60-bit correlation 390 undoubtedly indicate a better matched TFEC than the first-matched TFEC that corresponds to the 60-bit correlation 380.

Using Best Match to Identify TFEC

Figure 4:
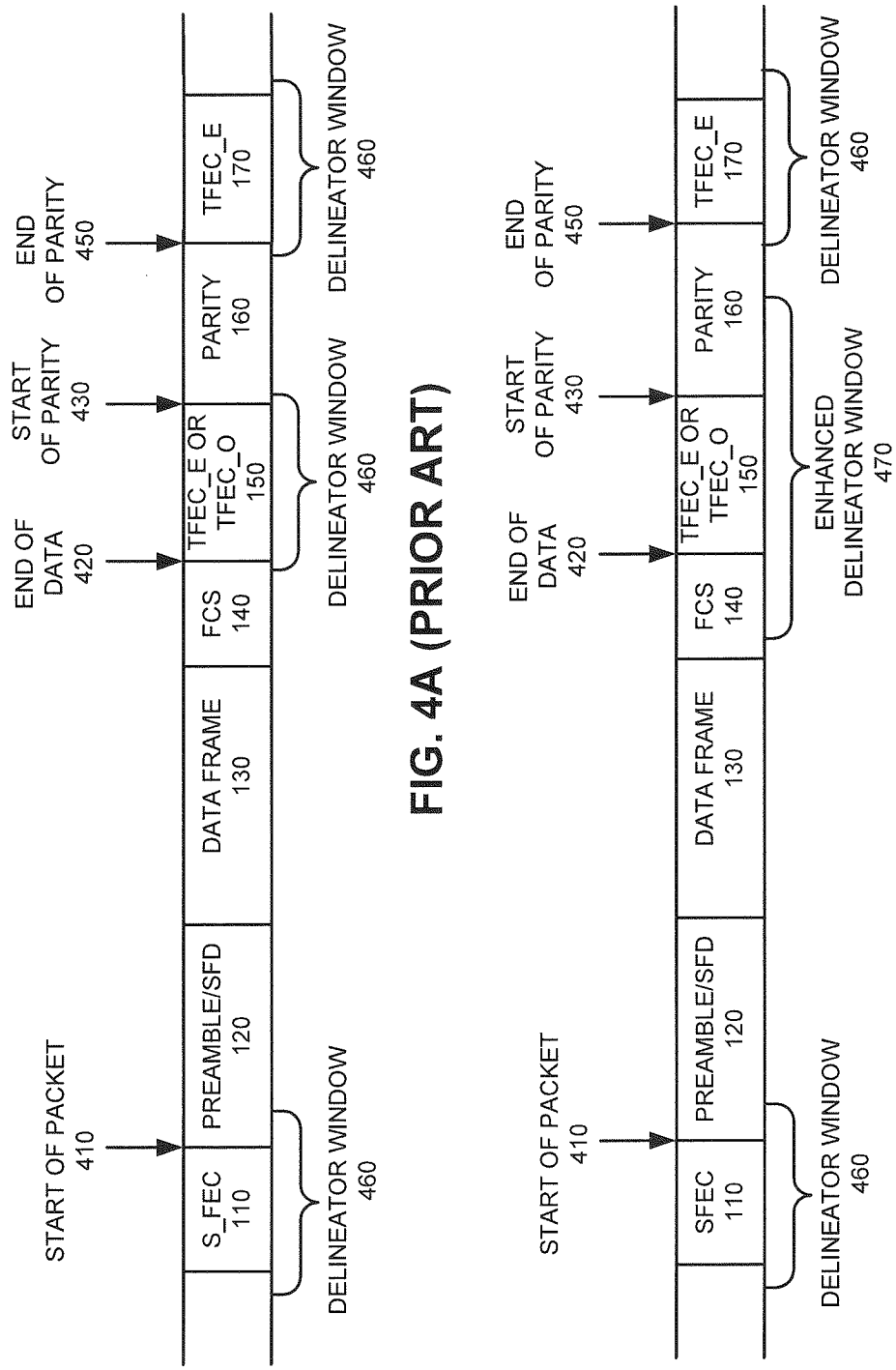
FIG. 4A illustrates an exemplary delineator window that a receiving device uses to detect a TFEC sequence in accordance with the prior arts.
FIG. 4B illustrates an improved delineator window that a receiving device uses to detect a TFEC sequence in accordance with an embodiment.

FIG. 4A illustrates an exemplary delineator window that a receiving device uses to detect TFEC sequence (prior art). In this example, the receiving device scans through a delineator window 460 to detect a SFEC 110 at the start of a packet 410, a TFEC_E or TFEC_O 150 that delineates between the end of data 420 and the start of parity 430, or a TFEC_E that follows the end of parity 450. Furthermore, the receiving device uses a matching logic that matches the first bit sequence with a Hamming distance of less than 5 bits to SFEC, TFEC_E, or TFEC_O as the identified FEC code.

FIG. 4B illustrates an improved delineator window that a receiving device uses to detect TFEC sequence in accordance with an embodiment of the present invention. In this embodiment, the receiving device uses the same delineator window 460 to detect SFEC 110 before the start of packet 410 and TFEC_E 170 following the end of parity 450. However, with respect to the detection of TFEC_E 150 that delineates the end of data 420 and the start of parity 430, the receiving device uses an enhanced delineator window 470.

Enhanced delineator window 470 corresponds to a certain number of bits in the incoming bit stream. The length of enhanced delineator window 470 is greater than that of the conventional delineator window 460. This configuration allows the receiving device to scan for a longer stream of incoming bits for the target TFEC_E. Therefore, it is more likely for the receiving device to identify multiple potential matches for the target TFEC_E. Note that the receiving device identifies a potential match for the target TFEC_E when the Hamming distance between a consecutive set of the frame bits within enhanced delineator window 470 and the TFEC_E is less than 5 bits.

The match logic under the current IEEE 802.3 standard identifies the first potential match within delineator window 460 as the target TFEC_E. As illustrated in FIG. 3, such match logic may result in matching the target TFEC_E prematurely, because it ignores other potential matches that can occur later within the delineator window. By contrast, the best-match logic in accordance with the present invention implements enhanced delineator window 470 that is longer than conventional delineator window 460. The best-match logic scans all frame bits between the start and end positions as determined by enhanced delineator window 470 for potential matches. Moreover, the best-match logic identifies the potential match having the shortest Hamming distance to TFEC_E as the target TFEC_E. The identified target TFEC_E may not be the first potential match in the bit stream. Consequently, this enhanced delineator window effectively reduces the likelihood of matching bits of an incoming bit stream to TFEC_E prematurely by a receiving device.

Figure 5:
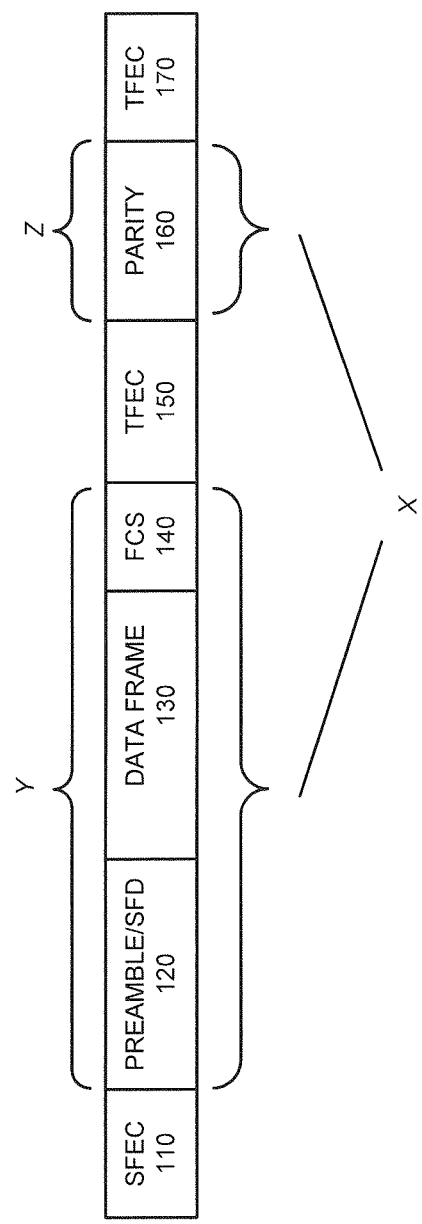
FIG. 5 illustrates how to calculate the length of FEC parity bits in accordance with an embodiment.

FIG. 5 illustrates how to calculate the length of FEC parity bits in accordance with an embodiment of the present invention. When the receiving device scans the input stream, it is possible to learn the total length, X, of the Ethernet frame and the FEC parity bits, because SFEC 110 and the second TFEC delimiter 170 can be easily recognized. The total length of the Ethernet frame is denoted as Y, and the length of FEC parity bits 160 is denoted as Z. Because the FEC scheme uses RS(255, 239) code, for every 239-byte block from the data symbol section (bits within Y), there is a 16-byte parity group in the parity section (bits within Z). Therefore, the length of the parity can be calculated as:

$$Z = \left\lceil \frac{X}{(m+n)} \right\rceil \cdot n \qquad (1)$$

where $\lceil \ \rceil$ is the ceiling function;

m is the length of a block of bits from the conventional Ethernet frame and the first delimiter, which is 239; and n is the length of a group of FEC parity bits corresponding to a block of bits from the conventional Ethernet frame and the first delimiter, which is 16. Note that a ceiling function is used because Z may not contain an integer number of 239 bytes, and because a block with less than 239 data bytes is padded up to have 239 bytes for the FEC calculation.

FIG. 6 presents a flow chart illustrating the process of calculating the length of FEC parity bits and subsequent data delineation in accordance with an embodiment of the present invention. The system within a receiving device starts by receiving an FEC-encoded Ethernet frame (i.e., the data stream after an SFEC up to the second TFEC) (operation 610). Next, the system separates the Ethernet frame from the best-matched TFEC (operation 615). The system further determines the total length of the conventional Ethernet frame, and first TFEC delimiter, and the FEC parity bits (operation 620). The system then calculates the length of FEC parity bits based on equation (1) (operation 630). Based on the delineated FEC parity bits, the system corrects any possible bit errors that occur within the conventional Ethernet frame and the first TFEC delimiter (operation 640). Note that the first TFEC delimiter, if even, is identified using the best-match logic.

FIG. 7 presents a flow chart illustrating the process of identifying TFEC_E using the best-match logic in accordance with an embodiment of the present invention. The system within a receiving device starts by receiving an incoming FEC-encoded Ethernet frame in a bit stream (operation 710). Next, the system scans the bit stream of the received frame for a a potential match for TFEC_E (operation 720). In doing so, the system determines whether the hamming distance of a given number of bits received so far (which is equivalent to the number of bits in a TFEC_E) and the TFEC_E is less than a threshold (operation 730). If so, the system stores the current bit position and the corresponding hamming distance in a register (operation 740). Otherwise, the system continues to receive the next incoming bit (operation 710).

The system then continues to receive and scan the next incoming bit (operation 750). After the next bit is received, the system determines whether the hamming distance between the new bit group (which is shifted by one bit due to the new incoming bit) and TFEC_E is less than the threshold (operation 760). If so, the system further determines whether the new hamming distance is less than the one previously stored in the register (operation 770). If the new hamming distance is shorter (which results in a "yes" value in operation 770), the system replaces the bit position and hamming distance in the register with the current bit position and hamming distance (operation 780).

If, however, the new hamming distance is greater than the threshold (which results in a "yes" value in operation 760) or greater than the hamming distance stored in the register (which results in a "no" value in operation 770), the system keeps the previous hamming distance and bit position in the register, and determines whether the end of the enhanced delineator window has been reached (operation 790). If the end of the enhanced delineator window has not been reached, the system continues to receive the next incoming bit (operation 750). If the end of the window has been reached, the system then identifies the best TFEC_E position based on the bit position stored in the register, thereby providing the best-matched TFEC_E position (operation 792).

The data structures and code described in this detailed description are typically stored on a computer-readable storage medium, which may be any device or medium that can store code and/or data for use by a computer system. The computer-readable storage medium includes, but is not limited to, volatile memory, non-volatile memory, magnetic and optical storage devices such as disk drives, magnetic tape, CDs (compact discs), DVDs (digital versatile discs or digital video discs), or other media capable of storing code and/or data now known or later developed.

The methods and processes described in the detailed description section can be embodied as code and/or data, which can be stored in a computer-readable storage medium as described above. When a computer system reads and executes the code and/or data stored on the computer-readable storage medium, the computer system performs the methods and processes embodied as data structures and code and stored within the computer-readable storage medium.

Furthermore, methods and processes described herein can be included in hardware modules or apparatus. These modules or apparatus may include, but are not limited to, an application-specific integrated circuit (ASIC) chip, a field-programmable gate array (FPGA), a dedicated or shared processor that executes a particular software module or a piece of code at a particular time, and/or other programmable-logic devices now known or later developed. When the hardware modules or apparatus are activated, they perform the methods and processes included within them.

The foregoing descriptions of various embodiments have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention.

What is claimed is:

1. A method for identifying an even delimiter in a forward error correction (FEC)-coded Ethernet frame, comprising:
receiving an FEC-coded Ethernet frame that includes an even delimiter used to separate a conventional Ethernet frame and FEC parity bits in the FEC-coded Ethernet frame, wherein the even delimiter is a predetermined bit sequence;
scanning a bit stream of the FEC-coded Ethernet frame;
determining a first Hamming distance between a first consecutive set of frame bits in the bit stream and the even delimiter, wherein the first Hamming distance is shorter than a predefined value;
determining a second Hamming distance between a subsequent second consecutive set of frame bits in the bit stream and the even delimiter, wherein the second Hamming distance is shorter than the predefined value;
selecting one of the first and second consecutive sets of frame bits having the shorter Hamming distance as the even delimiter.

2. The method of claim 1, wherein the even delimiter starts with first code groups /T/R/ according to the IEEE 802.3ah Ethernet standard, and includes at least another code group after the first code groups /T/R/.

3. The method of claim 1, wherein the first and second consecutive sets of frame bits are located within an enhanced delineator window, which specifies a start position and an end position in the bit stream.

4. The method of claim 1, wherein the even delimiter ends with second code groups /T/R/ according to the IEEE 802.3ah Ethernet standard.

5. The method of claim 2, wherein selecting one of the first and second consecutive sets of frame bits having the shorter Hamming distance includes identifying a first /T/R/ sequence in the bit stream, which corresponds to the first code groups /T/R/ in the even delimiter.

6. The method of claim 1, wherein the even delimiter is used to separate the conventional Ethernet frame from the FEC parity bits when the last symbol of the conventional Ethernet frame is an odd-numbered position.

7. The method of claim 1, wherein determining the second Hamming distance between the subsequent second consecutive set of frame bits is repeated until either a best matched set with the shortest Hamming distance to the even delimiter is found or an end of an enhanced delineator window is reached.

8. The method of claim 1, wherein the even delimiter is configured to indicate an end of a data frame included in the conventional Ethernet frame.

9. An apparatus for identifying an even delimiter in a forward error correction (FEC)-coded Ethernet frame, comprising:
   a processor;
   a receiving mechanism configured to receive an FEC-coded Ethernet frame that includes an even delimiter used to separate a conventional Ethernet frame and FEC parity bits in the FEC-coded Ethernet frame, wherein the even delimiter is a predetermined bit sequence;
   a scanning mechanism configured to scan a bit stream of the FEC-coded Ethernet frame;
   a determining mechanism configured to determine a first Hamming distance between a first consecutive set of frame bits in the bit stream and the even delimiter, and to determine a second Hamming distance between a subsequent second consecutive set of frame bits in the bit stream and the even delimiter, wherein the first and second Hamming distances are shorter than a predefined value; and
   a selecting mechanism configured to select one of the first and second consecutive sets of frame bits having the shorter Hamming distance as the even delimiter.

10. The apparatus of claim 9, wherein the even delimiter starts with first code groups /T/R/ according to the IEEE 802.3ah Ethernet standard, and includes at least another code group after the first code groups /T/R/.

11. The apparatus of claim 9, wherein the first and second consecutive sets of frame bits are located within an enhanced delineator window, which specifies a start position and an end position in the bit stream.

12. The apparatus of claim 9, wherein the even delimiter ends with second code groups /T/R/ according to the IEEE 802.3ah Ethernet standard.

13. The apparatus of claim 12, wherein the selecting mechanism is configured to enable identifying a first /T/R/ sequence in the bit stream, which corresponds to the first code groups /T/R/ in the even delimiter.

14. The apparatus of claim 9, wherein the even delimiter is used to separate the conventional Ethernet frame from the FEC parity bits when the last symbol of the conventional Ethernet frame is an odd-numbered position.

15. The apparatus of claim 9, wherein determining the second Hamming distance between the subsequent consecutive set of frame bits in the bit stream is repeated until either a best matched set with the shortest Hamming distance to the even delimiter is found or an end of an enhanced delineator window is reached.

16. A non-transitory computer readable storage medium storing instructions which when executed by a computer cause the computer to perform a method for identifying an even delimiter in a forward error correction (FEC)-coded Ethernet frame, the method comprising:
   receiving an FEC-coded Ethernet frame that includes the even delimiter used to separate a conventional Ethernet frame and FEC parity bits in the FEC-coded Ethernet frame, wherein the even delimiter is a predetermined bit sequence;
   scanning a bit stream of the FEC-coded Ethernet frame;
   determining a first Hamming distance between a first consecutive set of frame bits in the bit stream and the even delimiter, wherein the first Hamming distance is shorter than a predefined value;
   determining a second Hamming distance between a subsequent second consecutive set of frame bits in the bit stream and the even delimiter, wherein the second Hamming distance is shorter than the predefined value; and
   selecting one of the first and second consecutive sets of frame bits having the shorter Hamming distance as the even delimiter.

17. The non-transitory computer readable storage medium of claim 16, wherein the first and second consecutive sets of frame bits are located within an enhanced delineator window, which specifies a start position and an end position in the bit stream.

* * * * *